US010755015B2

(12) United States Patent
Victory et al.

(10) Patent No.: US 10,755,015 B2
(45) Date of Patent: Aug. 25, 2020

(54) AGNOSTIC MODEL OF SEMICONDUCTOR DEVICES AND RELATED METHODS

(71) Applicant: SEMICONDUCTOR COMPONENTS INDUSTRIES, LLC, Phoenix, AZ (US)

(72) Inventors: James Joseph Victory, Weyarn (DE); Mehrdad Baghaie Yazdi, Munich (DE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 60 days.

(21) Appl. No.: 16/107,158

(22) Filed: Aug. 21, 2018

(65) Prior Publication Data

US 2019/0057175 A1 Feb. 21, 2019

Related U.S. Application Data

(60) Provisional application No. 62/548,183, filed on Aug. 21, 2017.

(51) Int. Cl.
*G06F 30/367* (2020.01)
*G06F 30/39* (2020.01)

(52) U.S. Cl.
CPC .......... *G06F 30/367* (2020.01); *G06F 30/39* (2020.01)

(58) Field of Classification Search
CPC .......... G06F 17/5036; G06F 17/5068; G06F 30/367; G06F 30/39
See application file for complete search history.

(56) References Cited

U.S. PATENT DOCUMENTS

| 6,266,629 | B1 * | 7/2001 | Mallavarpu | G06F 17/5036 |
| | | | | 703/13 |
| 7,334,199 | B1 * | 2/2008 | Russell, Jr. | G06F 17/5036 |
| | | | | 702/196 |
| 8,626,482 | B2 * | 1/2014 | Tseng | G06F 17/5022 |
| | | | | 703/14 |
| 8,630,835 | B2 * | 1/2014 | Tanomura | G06F 17/5036 |
| | | | | 703/14 |
| 9,460,250 | B1 * | 10/2016 | Schutt-Aine | G06F 17/5036 |

(Continued)

OTHER PUBLICATIONS

He et al. "A physically based scalable SPICE model for silicon carbide power MOSFETs," 2017 IEEE Applied Power Electronics Conference and Exposition (APEC), Tampa, FL, 2017, pp. 2678-2684, doi: 10.1109/APEC.2017.7931077.

(Continued)

*Primary Examiner* — Nha T Nguyen
(74) *Attorney, Agent, or Firm* — Chamberlain Hrdlicka

(57) ABSTRACT

The disclosed embodiments include systems and methods of building an agnostic model of a physically-based semiconductor device. The embodiments may include implementing, in the agnostic model, an arbitrary voltage source in series between a node voltage and a zero value voltage source, implementing, in the agnostic model, a reference capacitor in series between the node voltage and a dummy voltage source, implementing, in the agnostic model, an arbitrary current source between a first node and a second node. The arbitrary current source may include the dummy voltage source divided by the reference capacitor, and the arbitrary current source may model the change in the any property, such as charge, over time within the semiconductor device.

16 Claims, 2 Drawing Sheets

(56) References Cited

U.S. PATENT DOCUMENTS

| | | | | |
|---|---|---|---|---|
| 9,712,315 | B1* | 7/2017 | Chen | G01R 31/28 |
| 2004/0049749 | A1* | 3/2004 | Croix | G06F 17/5036 |
| | | | | 716/111 |
| 2004/0059558 | A1* | 3/2004 | Korobkov | G06F 17/5036 |
| | | | | 703/14 |
| 2004/0193390 | A1* | 9/2004 | Drennan | G06F 17/5036 |
| | | | | 703/2 |
| 2006/0161413 | A1* | 7/2006 | Wei | G06F 17/5022 |
| | | | | 703/14 |
| 2006/0224374 | A1* | 10/2006 | Kwon | G06F 17/5036 |
| | | | | 703/15 |
| 2012/0185223 | A1* | 7/2012 | Wu | G06F 17/5036 |
| | | | | 703/2 |
| 2014/0012559 | A1* | 1/2014 | Sakai | G06F 17/5036 |
| | | | | 703/14 |
| 2016/0063159 | A1* | 3/2016 | Hidaka | G06F 17/10 |
| | | | | 703/2 |
| 2016/0070837 | A1* | 3/2016 | Hidaka | G06F 17/5036 |
| | | | | 703/2 |
| 2018/0096088 | A1* | 4/2018 | Itakura | G06F 17/5036 |
| 2018/0259570 | A1* | 9/2018 | Henley | H05B 33/0842 |
| 2018/0276328 | A1* | 9/2018 | Kobayashi | G06F 17/5045 |

OTHER PUBLICATIONS

Victory et al. "A Physically Based Scalable SPICE Model for High-Voltage Super-Junction MOSFETs," PCIM Europe 2014; International Exhibition and Conference for Power Electronics, Intelligent Motion, Renewable Energy and Energy Management, Nuremberg, Germany, 2014, pp. 958-963.

Victory et al. "A physically based scalable SPICE model for Shielded-Gate Trench Power MOSFETs," 2016 28th International Symposium on Power Semiconductor Devices and ICs (ISPSD), Prague, 2016, 4 pages, doi: 10.1109/ISPSD.2016.7520817.

Yazdi et al. "A Scaled PIN Diode SPICE Model for Power System Optimization," PCIM Europe 2017; International Exhibition and Conference for Power Electronics, Intelligent Motion, Renewable Energy and Energy Management, Nuremberg, Germany, 2017, 5 pages.

* cited by examiner

US 10,755,015 B2

AGNOSTIC MODEL OF SEMICONDUCTOR DEVICES AND RELATED METHODS

BACKGROUND

Semiconductor devices can be digitally implemented as models that may be tested within a simulator to determine how the actual characteristics of the semiconductor devices will operate after being manufactured. Each model instructs the simulators about the physical properties of the modeled circuitry and/or how other physical interactions affect the flow of electricity through the modeled circuitry. For example, the models may include temperature dependent currents, charges, and capacitances for a location comprising a semiconductor device. For a device that has existed and is used within a circuit in generally the same configuration for a period of time, the simulator may employ a primitive (e.g., SPICE primitive) of that device within the model.

The primitives are models that have been improved (e.g., bugs removed, flow paths optimized, etc.) such that the simulators quickly and accurately produce a solution to the flow of electricity when modeling circuitry that uses the primitive. Primitives, however, do not exist for every device that needs to be modeled. Model designers, therefore, have to write their own models when testing either the device itself, or circuits that may include the device. Input code commands and/or tools used to create models often vary depending on the simulator (e.g., SPICE2, SPICE3, PSPICE, LTSPICE, HSPICE, ELDO, MicroCAP, Simetrix, Spectre, ADS, SABER, and Simplorer etc.). This can multiply the work required to create models because the source code may have to be written differently depending on which simulator the model is created for.

BRIEF DESCRIPTION OF THE DRAWINGS

Embodiments of the invention are described with reference to the following figures. The same numbers are used throughout the figures to reference like features and components. The features depicted in the figures are not necessarily shown to scale. Certain features of the embodiments may be shown exaggerated in scale or in somewhat schematic form, and some details of elements may not be shown in the interest of clarity and conciseness.

DETAILED DESCRIPTION

One variation between simulators that can increase the need for additional models is the number and types of sources/commands that each simulator may natively draw from. For example, some simulators may recognize and find solutions for models that utilize different types of physical properties, while others may not. Specifically, some simulators acknowledge and handle models utilizing a time based derivative of a property like charge Q (i.e., dQ/dt), while other simulators do not. It has thus far not been possible to define dQ/dt for an agnostic model that may be used in any simulator. Defining dQ/dt as a function of sources/commands that are universal to all simulators, however, would enable models to be agnostic, meaning that the model may be used in simulators with different syntax types without changing the command language. As explained in detail below, once the device physics for a particular device is derived, a model designer can implement universal sources to implement physical temperature dependent equations for currents (I), voltages (V), charges (Q), and capacitances (C). In this application, implementing or implementation includes entering code, or otherwise programming the models to include a particular command.

Figure 1:
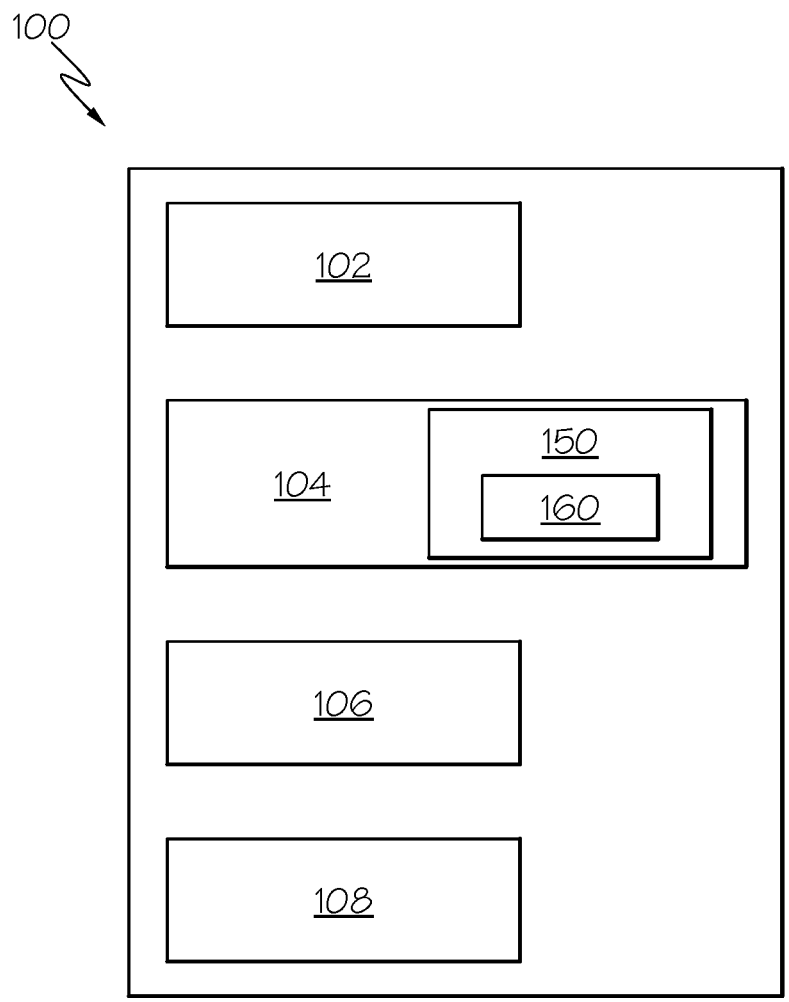
FIG. 1 is a schematic diagram of a computer-implemented modeling system for running a semiconductor simulator.

Turning now to the drawings, FIG. 1 is a schematic diagram of a computer-implemented modeling system 100 for running a generic SPICE simulator. The system 100 includes a processor 102, a memory 104, a display 106, and input devices 108 such as keyboard, mouse, touch pad, or other device for an operator to input or upload instructions for storage on the memory 104. The processor 102 may include multiple cores or multiple individual processor chips to run instructions included on the memory 104. The memory 104 includes software instructions in the form of computer readable program code to perform embodiments of the invention may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that, when executed by a processor(s), is configured to perform one or more embodiments of the invention. The display 106 displays the results of the processes run by the processor 102, and any inputs that are completed through the input device 108.

The memory 104 (i.e., instructions stored on the memory 104) may include a simulator 150 that simulates a semiconductor device and/or a comprehensive circuit that includes a number of semiconductor devices. The simulator 150 employs models 160 that represent the physical properties and interactions between the semiconductor devices. The simulator 150 may include an analysis/syntax type that does not include a source operator for dX/dt where X is any physical property of the semiconductor device. For example, X may include a charge Q. For example, if the simulator 150 utilizes alternating current analysis or transient analysis, the simulator 150 usually does not include such an operator. In order to create a model 160 that utilizes dQ/dt and is agnostic to all simulators 150, a combination of universal source operators must be used. That is, the model 160 may be used in a second simulator 150 in a different system 100 with only minimal syntactical changes (i.e., changing brackets types, adjusting code line finishers, etc.). For example, the model 160 may originally be designed for PSPICE, but may work equally well in ADS, or vice versa.

Once the model 160 is input into the simulator 150, the simulator 150 tests the circuit and displays the result of the test on the display 106. The result may include a convergence of the flow paths of signals through the circuit such that speed, signal strength, IV, CV, transient, and thermal behavior may be apparent for the overall design of the circuit. After the simulator results are finished and displayed, the model 160 may be adjusted to perhaps better reflect the circuit design. Additionally, a new design of the circuit including a different model may also be implemented and re-tested. When a circuit design is implemented sufficiently, the circuit may then be manufactured for physical testing and eventual mass-production.

Figure 2:
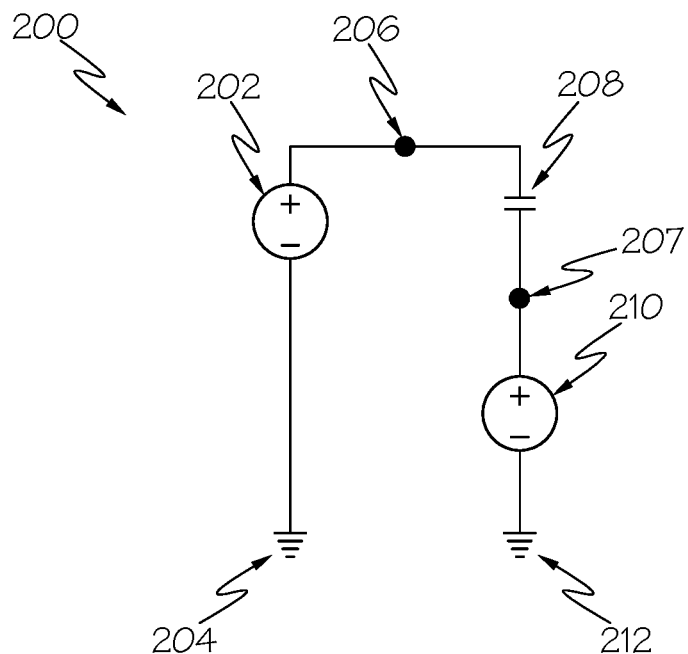
FIG. 2 is a schematic view of an embodiment of a circuit having universal operators that may be implemented in a model to represent a changing charge over time.

FIG. 2 is a schematic view of an embodiment of a circuit 200 having universal operators that may be implemented in a model (e.g., the model 160) to represent dQ/dt. In the circuit 200, an arbitrary voltage source 202 is implemented in series between a node voltage 206 and a zero value voltage 204 (i.e., ground). The node voltage 206 is given a value as an equation representing a physical property at a location within the circuit 200. For example, the physical property may be a charge Q associated with a PN junction, the electric field within a diode, or any other physical property of a specific device or circuit. The equation for the node voltage 206 is written into the source operator for the node voltage 206. The node voltage 206 is thus representative of the physical property, in this example charge Q.

The circuit 200 also includes a reference capacitor 208 between nodes 206 and 207 in series with a dummy voltage source with value=0 210. The current through the reference capacitor 208 is given by the following circuit theory:

$$I_{Cref} = C_{refd} \frac{dV_{ref}}{dt}$$

where $C_{refd}$ is the reference capacitor and $V_{ref}$ is the node voltage 206 since the voltage of element 210 is 0. Since the same current flows through $C_{refd}$ and the dummy voltage source 210, the dummy voltage 210 provides a mechanism to monitor the current flowing through the reference capacitor 208.

With this relationship set up between the arbitrary voltage source 202, the node voltage 206, and the dummy voltage 210, an arbitrary current source may be placed in another part of the model to implement the time based derivative of charge at the node voltage 206. Specifically, the arbitrary current source (e.g., $I_{ref}$, 306 below) may be implemented with a value of:

$$I_{ref} = \frac{I(V_{dummy})}{C_{refd}}$$

where $V_{dummy}$ is the dummy voltage source 210. Since $I(V_{dummy})=I_{Crefd}$, then:

$$I_{ref} = \frac{C_{refd} \frac{dV_{ref}}{dt}}{C_{refd}}$$

Further, since $V_{ref}$ is the same as the node voltage 206=Q, one arrives at $$I_{ref} = \frac{dQ}{dt}$$

which in this example is the value of the arbitrary current source. The arbitrary current source is then located within the circuit of the device model. I=dQ/dt is the circuit theory relation between current I and charge Q.

Figure 3:
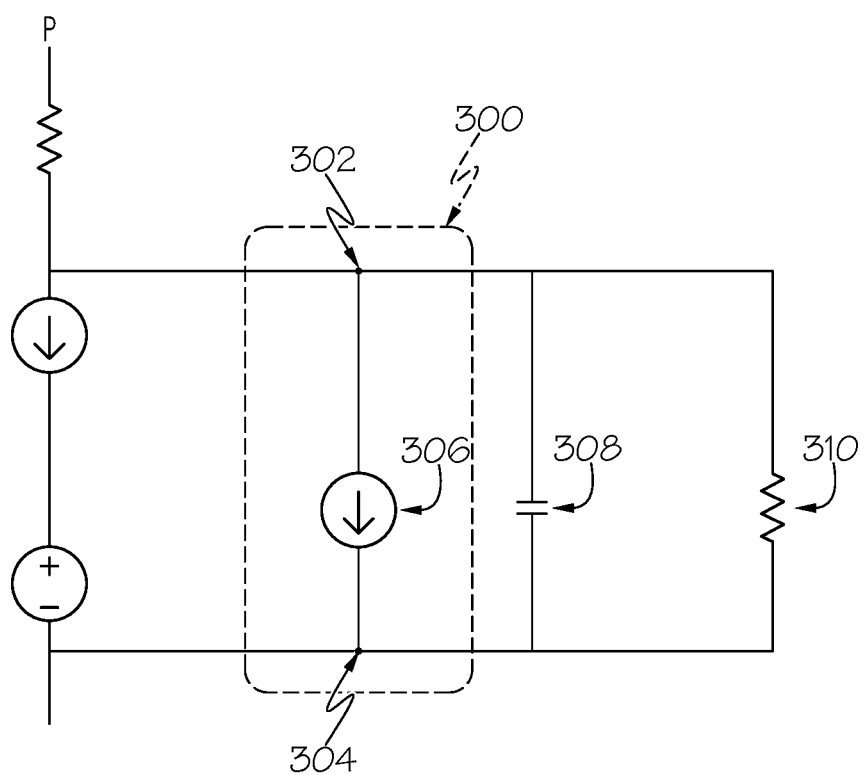
FIG. 3 is a schematic view of a circuit having an arbitrary current source between two nodes implemented in a model of a semiconductor device.

FIG. 3 is a schematic view of a subcircuit 300 having an arbitrary current source 306 between two nodes 302, 304 implemented in a model of a semiconductor device. In the illustrated embodiment, the subcircuit 300 includes other elements such as a capacitor 308 and a resistor 310 in parallel with the current source 306. These arbitrary elements compose other parts of the device model which would be understood by model designers looking to use the time based derivative of charge in this example.

Implementing the sources into a model may include defining elements such as:
.param myCref=1e-6
E_mycharge node_mycharge 0 VALUE={mycharge}
Crefd node_mycharge ref {myCref}
VDummy ref 0 0
Gddt_mycharge nodeX nodeY VALUE={I(VDummy)/myCref)}

The "E" element in generic SPICE is an arbitrary voltage source. Thus, "E_mycharge" is an arbitrary reference voltage (e.g., 202), "node_mycharge" is a node voltage (e.g., 206), "0" is a zero value voltage source (e.g., 204), and "mycharge" is an equation/value characterized by the physical characteristics of a location within a semiconductor device. For example, the equation input as the value of mycharge may represent the charge associated with a PN junction of a semiconductor device or any other physical property of a device.

Furthermore, in the implementation of source operators above, "Crefd" (e.g., 208) is a reference capacitor having a value defined at some point in the model as "myCref" such as in a ".param" PSPICE statement. As explained above, the reference capacitor is divided out of the final implementation for dQ/dt, but the value of myCref may be selected as a known value (e.g., one microfarad) that causes the simulator to converge. "VDummy" is a dummy voltage (e.g., 210), and "Gddt_mycharge" is an arbitrary current source (e.g., 306) implemented at a location within the model between two locations: "nodeX" and "nodeY." The "G" element in generic SPICE is an arbitrary current source. The value of the arbitrary current source is implemented, as stated above, as $$\frac{I(V_{dummy})}{myC_{ref}},$$

which gives dQ/dt at the location between the nodes.

Therefore, a model may be used in a simulator to define dQ/dt, even if that simulator analysis type does not typically include a source operator for dX/dt where X is any property, and set to Q in this example. Instead universal source operators such as arbitrary voltage sources, arbitrary current sources, capacitances, etc. are used to define and implement the charge and time based derivative of the charge.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

What is claimed is:
1. A method of building an agnostic model of a physically-based semiconductor device for use in a first simulator, comprising:
implementing, in the agnostic model, an arbitrary voltage source in series between a node voltage and a zero value voltage source;

implementing, in the agnostic model, an equation of a physical property of the semiconductor device at the node voltage;

implementing, in the agnostic model, a reference capacitor in series between the node voltage and a dummy voltage source;

implementing, in the agnostic model, an arbitrary current source between a first node and a second node, wherein the arbitrary current source comprises the dummy voltage source divided by the reference capacitor, and wherein the arbitrary current source models the change in the physical property over time regardless of whether the simulator includes a source operator for the change in the physical property over time; and running the agnostic model in the first simulator.

2. The method of claim 1, wherein the dummy voltage source comprises a zero value voltage source.

3. The method of claim 1, wherein implementing the arbitrary current source comprises a current monitored through the dummy voltage source.

4. The method of claim 1, wherein the dummy voltage comprises a zero value.

5. The method of claim 1, comprising running the agnostic model as part of a circuit in the first simulator.

6. The method of claim 5, comprising running the agnostic model in a second simulator comprising a different syntax from the first simulator.

7. The method of claim 5, wherein the first simulator comprises a SPICE simulator.

8. The method of claim 5, comprising fabricating the circuit.

9. The method of claim 1, comprising implementing the agnostic model in a comprehensive circuit.

10. The method of claim 1, wherein the node voltage comprises an equation representing a charge at a physical location within the semiconductor device.

11. A method of providing an agnostic model for a time based derivative of a property of a semiconductor device for use in a first simulator, comprising:

implementing an equation of the property at a node voltage into an arbitrary voltage source, wherein the node voltage is connected to a reference capacitor;

implementing a current through the reference capacitor as $$I_{Crefd} = C_{refd} \frac{dV_{ref}}{dt}$$

wherein $C_{refd}$ with capacitance value $myC_{ref}$ represents the reference capacitor and $V_{ref}$ represents the voltage across $C_{refd}$;

implementing a value into an arbitrary current source as $$I_{ref} = \frac{I(V_{dummy})}{myC_{ref}}$$

where $V_{dummy}$ is a dummy voltage connected in series to the reference capacitor, wherein the arbitrary current source models a change in the property over time regardless of whether the simulator includes a source operator for the change in the property over time; and running the agnostic model in a first simulator.

12. The method of claim 11, wherein the arbitrary current source is placed between a first node and a second node within a subcircuit of the agnostic model.

13. The method of claim 11, comprising running the agnostic model value in a second simulator comprising a different syntax from the first simulator.

14. The method of claim 11, wherein the property of the semiconductor device comprises an equation representing a charge at a physical location within the semiconductor device.

15. A non-transitory computer-readable medium that stores therein a program causing a processor to execute a process, comprising:

implementing, in an agnostic model for use in a first simulator, an arbitrary voltage source in series between a node voltage and a zero value voltage source;

implementing, in the agnostic model, a reference capacitor in series between the node voltage and a dummy voltage source;

implementing, in the agnostic model, an arbitrary current source between a first node and a second node, wherein the arbitrary current source comprises the dummy voltage source divided by the reference capacitor, and wherein the arbitrary current source models a change in charge over time within the semiconductor device regardless of whether the simulator includes a source operator for the change in charge over time; and running the agnostic model in a first simulator.

16. The non-transitory computer-readable medium of claim 15, wherein the process further comprises running the agnostic model in a second simulator comprising a different syntax from the first simulator.

* * * * *